United States Patent
Yonekura (10) Patent No.: US 7,465,663 B2
(45) Date of Patent: Dec. 16, 2008

(54) SEMICONDUCTOR DEVICE FABRICATION METHOD

(75) Inventor: Hiroshi Yonekura, Miyazaki (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 11/715,340

(22) Filed: Mar. 8, 2007

(65) Prior Publication Data

US 2007/0275524 A1    Nov. 29, 2007

(30) Foreign Application Priority Data

Mar. 31, 2006    (JP) ............................. 2006-098100

(51) Int. Cl.
*H01L 21/44*    (2006.01)

(52) U.S. Cl. ...................... 438/675; 438/680; 438/706; 257/E21.17; 257/21.245; 257/E21.278; 257/E21.293; 257/E21.304

(58) Field of Classification Search ................. 438/675, 438/197, 637, 680, 682, 683, 723, 724, 743, 438/744, 755, 756, 706
See application file for complete search history.

(56) References Cited

U.S. PATENT DOCUMENTS

| 6,201,735 B1 * | 3/2001 | Kato et al. ............. 365/185.11 |
| 6,452,274 B1 * | 9/2002 | Hasegawa et al. ........... 257/758 |
| 6,764,945 B2 * | 7/2004 | Ashihara et al. ............ 438/637 |

FOREIGN PATENT DOCUMENTS

JP    2004-119697    4/2004

* cited by examiner

*Primary Examiner*—David Nhu
(74) *Attorney, Agent, or Firm*—Volentine & Whitt, P.L.L.C.

(57) ABSTRACT

In fabrication of a semiconductor device which is provided with resistances and MOS transistors on the same substrate, conduction failures of contacts and leaching of wiring metal into a silicon substrate is prevented. Firstly, an underlying structure is prepared. Then, a silicon oxide layer is formed on the underlying structure. Then, a silicon nitride layer is formed on the silicon oxide layer. Then, an inter-layer insulation layer is formed on the silicon nitride layer. Then, a contact hole is formed penetrating through a laminate of the silicon oxide layer, the silicon nitride layer and the inter-layer insulation layer. A thickness of the silicon oxide layer is a value in a range from 32 nm to 48 nm.

6 Claims, 11 Drawing Sheets

SEMICONDUCTOR DEVICE FABRICATION METHOD

CROSS-REFERENCE TO RELATED APPLICATION

This application claims priority under 35 USC 119 from Japanese Patent Application No. 2006-098100, the disclosure of which is incorporated by reference herein.

BACKGROUND OF THE INVENTION

1. Field of the Invention

The present invention relates to a method for fabricating a semiconductor device.

2. Description of the Related Art

Among semiconductor devices which are currently mass-produced, there are semiconductor devices which, in order to improve functionality, are provided with a mixture of resistors and MOS transistors on the same substrate (see, for example, Japanese Patent Application Laid-Open (JP-A) No. 2004-119697). A resistor thereof is provided by, for example, implanting an impurity into a polysilicon layer formed on the substrate and then etching the polysilicon layer.

Figure 10:
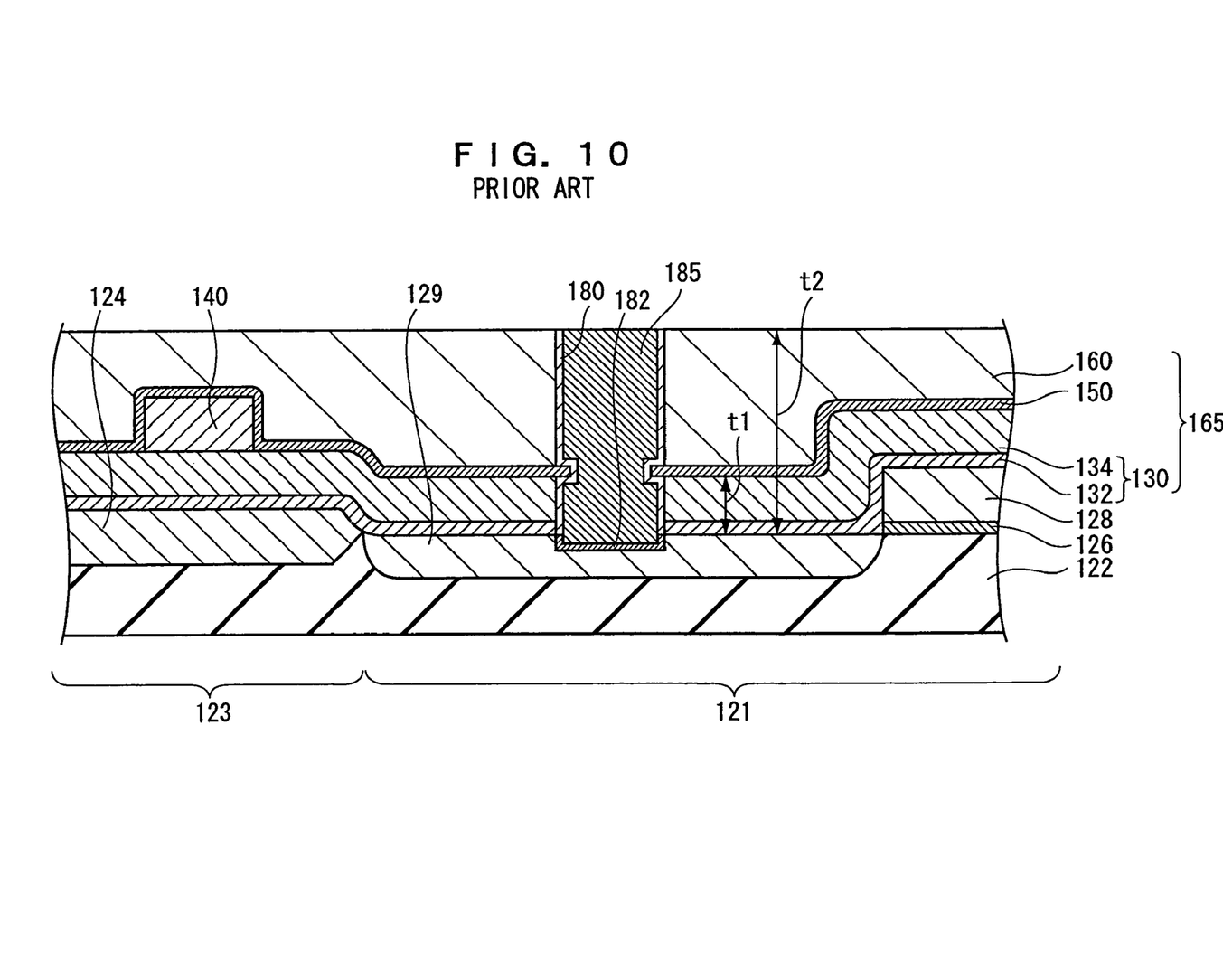
FIG. 10 is a sectional view for describing a conventional semiconductor device.

A conventional semiconductor device in which resistances and MOS transistors are formed on the same substrate will be described with reference to FIG. 10. FIG. 10 is a sectional view for describing the conventional semiconductor device.

An element isolation layer 124 is formed on a silicon substrate 122. A region at which this element isolation layer 124 is formed is referred to as an element isolation region 123. A MOS transistor region 121 is defined by the element isolation region 123. A gate oxide film 126 and a gate electrode 128 are layered, in that order, on the silicon substrate 122 within the MOS transistor region 121. A diffusion layer 129 is formed in the silicon substrate 122 within the MOS transistor region 121. The diffusion layer 129 has regional portions which are to function as a source and a drain of the MOS transistor, and is formed at locations sandwiching the gate oxide film 126 and gate electrode 128.

On the silicon substrate 122 at which the MOS transistor has been formed, a silicon oxide layer 130 is formed. The silicon oxide layer 130 is structured by laminating a mask oxide layer 132 and a resistance isolation oxide layer 134. A resistance 140 is then formed on the resistance isolation oxide layer 134 in the element isolation region 123. Thereafter, a silicon nitride layer 150 and an inter-layer insulation layer 160 are laminated, in that order, on the resistance isolation oxide layer 134 and the resistance 140.

The mask oxide layer 132 is employed as a mask when ion-implantation into the diffusion layer is being performed.

The resistance isolation oxide layer 134 is provided in order to prevent exposure of the silicon substrate 122 due to etching of the mask oxide layer 132 during etching for formation of the resistance 140. If the silicon substrate 122 were to be exposed, a region at which the silicon nitride layer 150 and the silicon substrate 122 touched would be formed, and an interface current would flow at the region at which the silicon nitride layer 150 and the silicon substrate 122 touched, which would be a cause of leaks.

A contact hole is formed penetrating through a laminate 165 of the silicon oxide layer 130, the silicon nitride layer 150 and the inter-layer insulation layer 160. A titanium conduction film 180 is formed on an inner wall face of the contact hole, and a contact plug 185 is formed over the titanium conduction film 180 so as to fill in the contact hole. The contact plug 185 is formed of, for example, tungsten. Here, at a lower portion of the contact hole, the titanium conduction film 180 takes the form of a titanium silicide 182.

In the conventional semiconductor device which has been described with reference to FIG. 10, a thickness t1 of the silicon oxide layer 130, which is structured by the mask oxide layer 132 and the resistance isolation oxide layer 134 being laminated, is around 90 nm at a region at which the contact hole is formed. Commonly, the mask oxide layer 132 is formed with a thickness of 20 nm and the resistance isolation oxide layer 134 is formed with a thickness of 70 nm. A thickness t2 of the laminate 165 of the mask oxide layer 132, the resistance isolation oxide layer 134, the silicon nitride layer 150 and the inter-layer insulation layer 160 is around 1050 nm.

In such a case, if the semiconductor device is left in the atmosphere for about 20 hours from after the contact hole is formed until when formation of the titanium conduction film 180, the titanium silicide 182 and the contact plug 185 is implemented, there is a problem in that anomalous leak currents occur in the semiconductor device and it cannot be used as a product.

Figure 11:
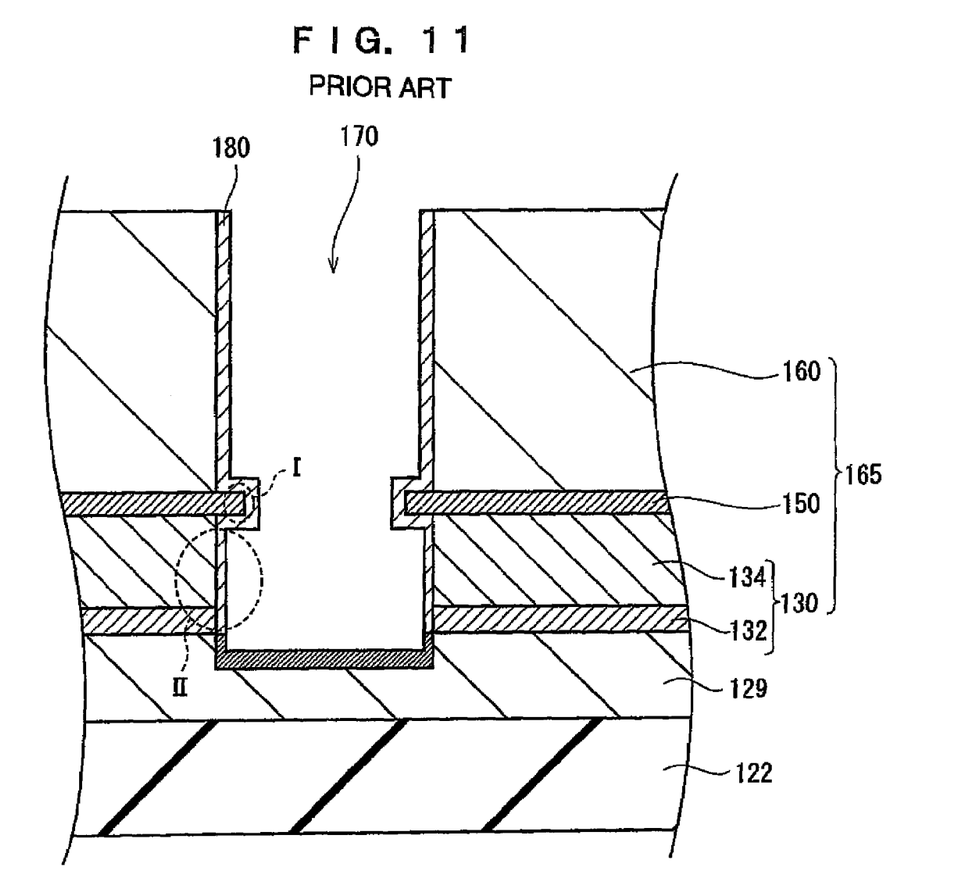
FIG. 11 is a diagram for describing formation of a titanium conduction film in a contact hole.

A cause of anomalous leak currents which occur in the semiconductor device will be described with reference to FIG. 11. FIG. 11 is a diagram for describing formation of the titanium conduction film in the contact hole.

A contact hole 170 is ordinarily formed so as to penetrate through the laminate 165 by photolithography and dry etching. At such a time, because an etching rate of the silicon nitride layer 150 is lower than that of the silicon oxide layer 130, the silicon nitride layer 150 remains in a flange form at the inner wall face of the contact hole 170 (i.e., the portion indicated by I in FIG. 11). In this state, when formation of the titanium conduction film 180 is implemented by sputtering, the titanium conduction film is formed with sufficient thickness at a portion of the contact hole 170 to the upper side of the silicon nitride layer 150, that is, at a side wall of the inter-layer insulation layer 160. In contrast, at a portion to the lower side of the silicon nitride layer 150 (i.e., the portion indicated by II in FIG. 11) that is, at a side wall of the silicon oxide layer 130, the silicon nitride layer 150 impedes formation of the titanium conduction film 180, and the titanium conduction film cannot be formed with sufficient thickness.

If the semiconductor device is left in the atmosphere in this condition, the silicon substrate reacts with, for example, moisture in the air, and produces silicon oxides and the like. As a result, the formation of the titanium silicide at the lower portion of the contact hole is impeded, which leads to failures in conduction with a contact. In addition, p-n junction breakdown occurs in the diffusion layer, due to leaching of a wiring metal into the silicon substrate or the like, and as a result, leakage currents occur.

Therefore, ordinarily, a semiconductor device is fabricated by processing such that a period for which it is left in the atmosphere after contact holes have been formed is as short as possible.

In order to address the issue described above, the present inventors have carried out rigorous investigations, and have discovered that the portion of the titanium conduction film which is not formed with sufficient thickness at the lower portion of the contact hole can be reduced by making the film thickness of the silicon oxide layer 130 below the silicon nitride layer 150 thinner, and as a result, excellent titanium silicide can be formed.

It has also been discovered that an excellent titanium silicide can be formed by forming the inter-layer insulation layer and forming the contact hole after having implemented an opening in the silicon nitride layer, and thus preventing the flange-like remnant of the silicon nitride layer at the inner wall of the contact hole.

SUMMARY OF THE INVENTION

The present invention has been devised in consideration of the problem described above, and an object of this invention is to provide a method for fabricating a silicon device which method prevents conduction failures of a contact plug that is provided penetrating through a silicon oxide layer, a silicon nitride layer and an inter-layer insulation layer, and prevents leaching of a wiring metal into a silicon substrate.

In order to achieve the object described above, a method for fabricating a semiconductor device of a first aspect includes the following steps. First, an underlying structure is prepared. Then, a silicon oxide layer is formed on the underlying structure. Then, a silicon nitride layer is formed on the silicon oxide layer. Then, an inter-layer insulation layer is formed on the silicon nitride layer. Then, a contact hole is formed penetrating through a laminate of the silicon oxide layer, the silicon nitride layer and the inter-layer insulation layer. Here, a thickness of the silicon oxide layer at a region at which the contact hole is formed is a value in a range from 32 to 48 nm.

A method for fabricating a semiconductor device of a second aspect includes the following steps. First, an underlying structure is prepared. Then, a silicon oxide layer is formed on the underlying structure. Then, a silicon nitride layer is formed on the silicon oxide layer. Then, an aperture portion which exposes the silicon oxide layer is formed in the silicon nitride layer. Then, an inter-layer insulation layer is formed on the silicon nitride layer and on the silicon oxide layer that is exposed in the aperture portion. Then, a contact hole is formed penetrating through a laminate of the silicon oxide layer, the silicon nitride layer and the inter-layer insulation layer. Here, a diameter of the aperture portion is a value in a range from 1.05 to 1.3 times a diameter of the contact hole.

According to the semiconductor device fabrication method of the first aspect, the thickness of the silicon oxide layer, being a value somewhere in the range from 32 to 48 nm, is thin in comparison with a conventional 90 nm. Therefore, a portion of a titanium conduction film that is not formed with sufficient thickness at a lower portion of the contact hole is reduced and, as a result, excellent titanium silicide can be formed.

Furthermore, according to the semiconductor device fabrication method of the second aspect, because the aperture portion is formed in the silicon nitride layer and thereafter the inter-layer insulation layer is formed and the contact hole is formed within the aperture portion, the silicon nitride layer will not remain in a flange form at the inner wall of the contact hole. Therefore, a titanium conduction film is formed with sufficient thickness even at a lower portion of the contact hole and, as a result, excellent titanium silicide can be formed.

BRIEF DESCRIPTION OF THE DRAWINGS

Preferred exemplary embodiments of the present invention will be described in detail based on the following figures, wherein.

DETAILED DESCRIPTION OF THE INVENTION

Herebelow, embodiments of this invention will be described with reference to the drawings. However, forms, sizes and positional relationships of structural elements are no more than general illustrations such that the invention can be understood. Moreover, while preferred structural examples of the present invention will be described below, compositions (materials), numerical conditions and the like of the structural elements are no more than preferred examples. Accordingly, the present invention is not to be limited to the embodiments described below.

FIRST EMBODIMENT

A semiconductor device fabrication method of a first embodiment will be described with reference to FIGS. 1 to 7. FIGS. 1 to 7 are process diagrams for explaining the semiconductor device fabrication method of the first embodiment, and are shown cut along a sectional plane.

Figure 1:
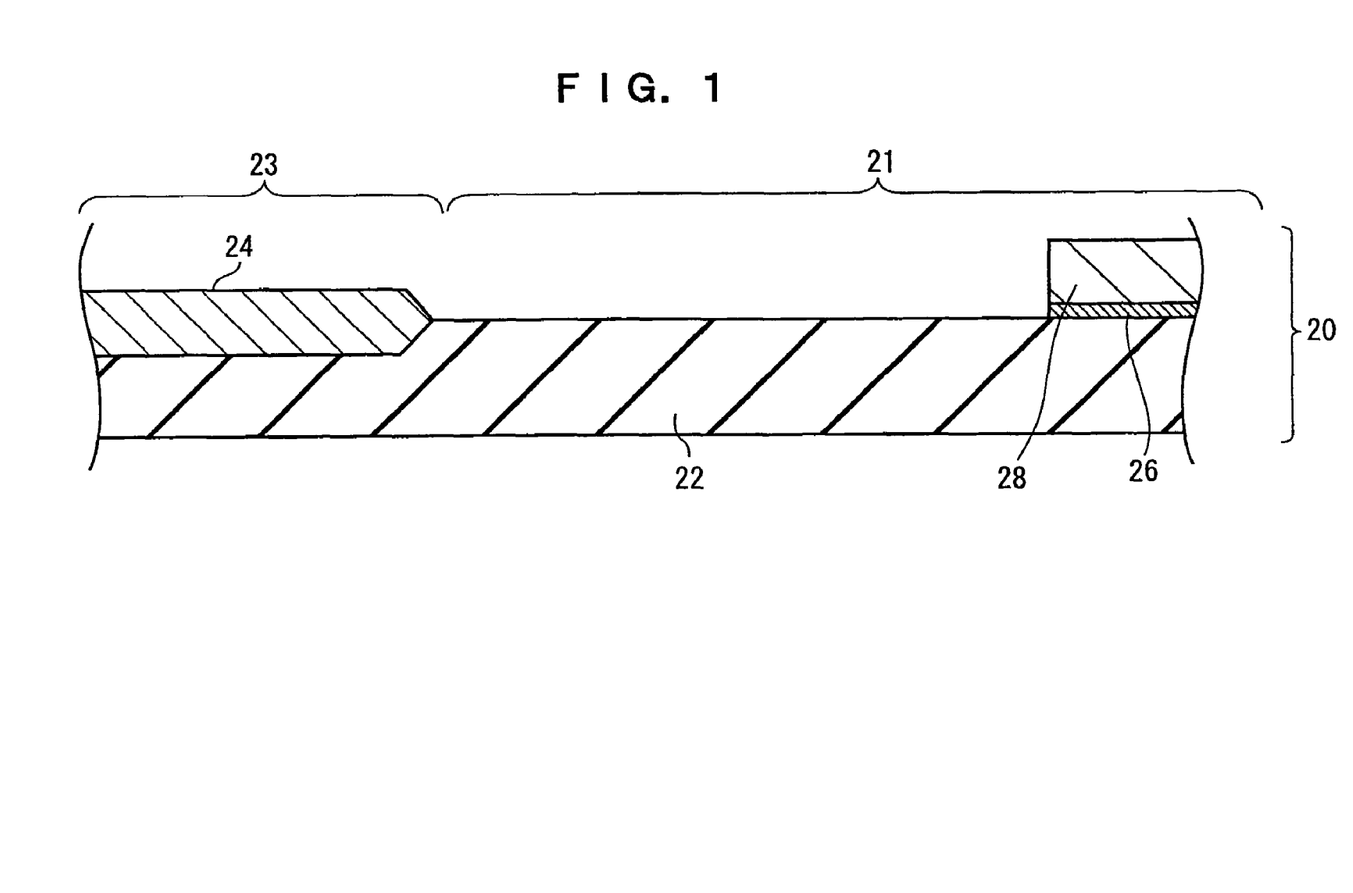
FIG. 1 is a process diagram for explaining a semiconductor device fabrication method of a first embodiment.

Firstly, an underlying structure 20 is prepared. The underlying structure 20 is provided with a silicon substrate 22, an element isolation layer 24 formed on the silicon substrate 22, and a gate oxide film 26 and a gate electrode 28 which are layered in that order on one major surface of the silicon substrate 22.

An element isolation region 23 and a MOS transistor formation region 21 are provided at the underlying structure 20. The element isolation region 23 is a region at which the element isolation layer 24 is formed, and the MOS transistor formation region 21 is a region defined by the element isolation region 23. The gate oxide film 26 and the gate electrode 28 are formed on the underlying structure 20 within the MOS transistor formation region 21 (FIG. 1).

Here, the element isolation layer 24, the gate oxide film 26 and the gate electrode 28 are formed using any of suitable conventionally known processes. Further, a p-well, an n-well or the like may be formed in the silicon substrate 22 of the MOS transistor formation region 21, in accordance with a conduction type of the silicon substrate 22, whether a MOS transistor that is to be formed is an n-type MOS transistor (nMOS) or a p-type MOS transistor (pMOS), and the like.

Next, by thermal oxidation in an oxygen atmosphere at 900° C., a mask oxide layer 32 is formed on the underlying structure 20. The mask oxide layer 32 that is formed here is a silicon oxide film with a thickness of 20±3 nm.

Next, at regions of the silicon substrate 22 in the MOS transistor formation region 21 which are to function as a source and a drain, a diffusion layer 29 is formed by ion-implantation. For example, As is implanted for a diffusion layer of an nMOS, whereas $BF_2$ is implanted for a diffusion layer of a pMOS.

Figure 2:
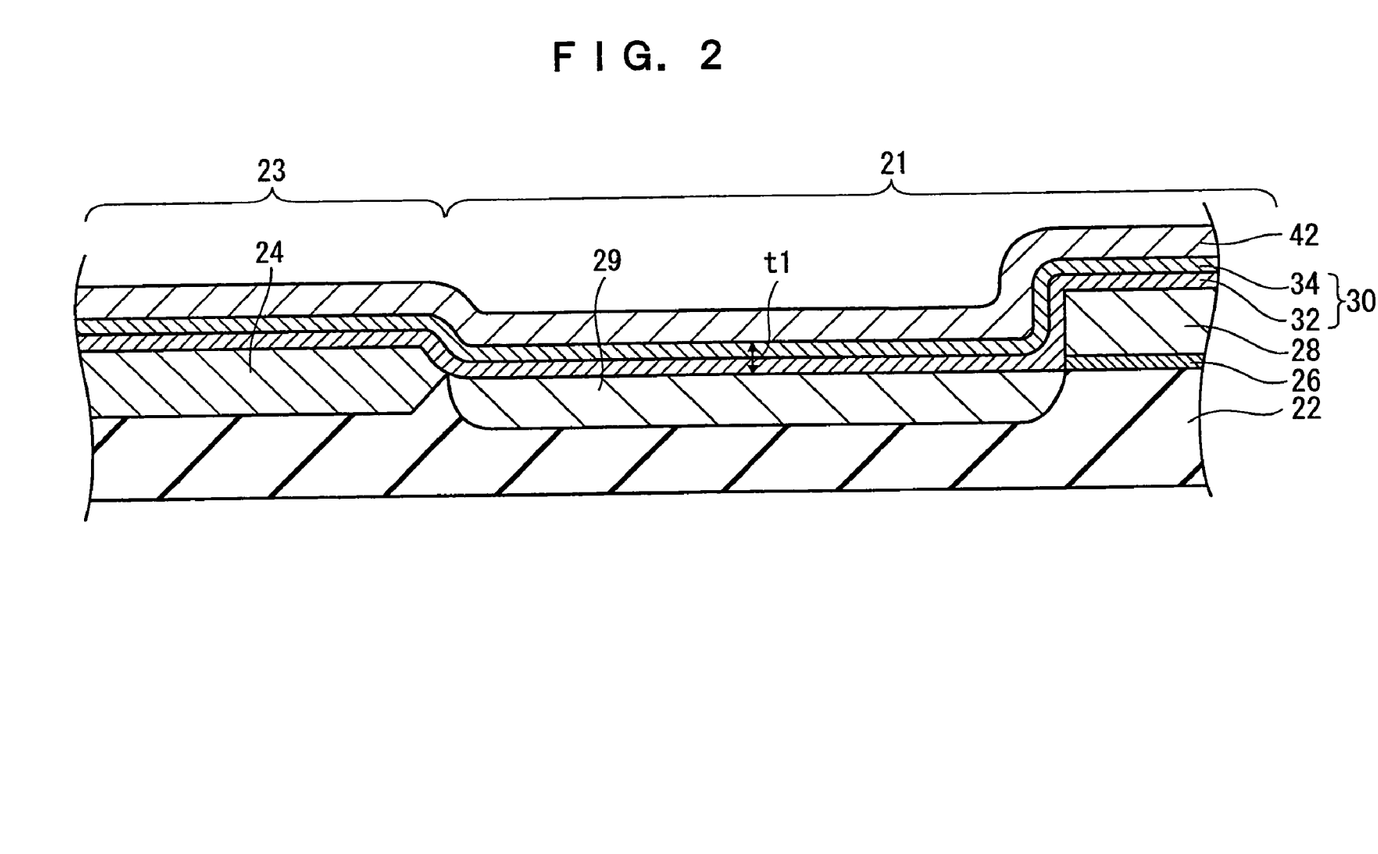
FIG. 2 is a process diagram for explaining the semiconductor device fabrication method of the first embodiment.

Next, by a low-pressure CVD (chemical vapor deposition) process using TEOS (tetraethyl orthosilicate) as a source gas, a resistance isolation oxide layer 34 is formed on the mask oxide layer 32. The resistance isolation oxide layer 34 that is formed here is a silicon oxide film with a thickness of 20±5 nm. Therefore, a thickness t1 of a silicon oxide layer 30 that is constituted by laminating the mask oxide layer 32 and the resistance isolation oxide layer 34 is a value in a range of 32 to 48 nm. A reason for forming the resistance isolation oxide layer 34 will be described later (FIG. 2).

Figure 3:
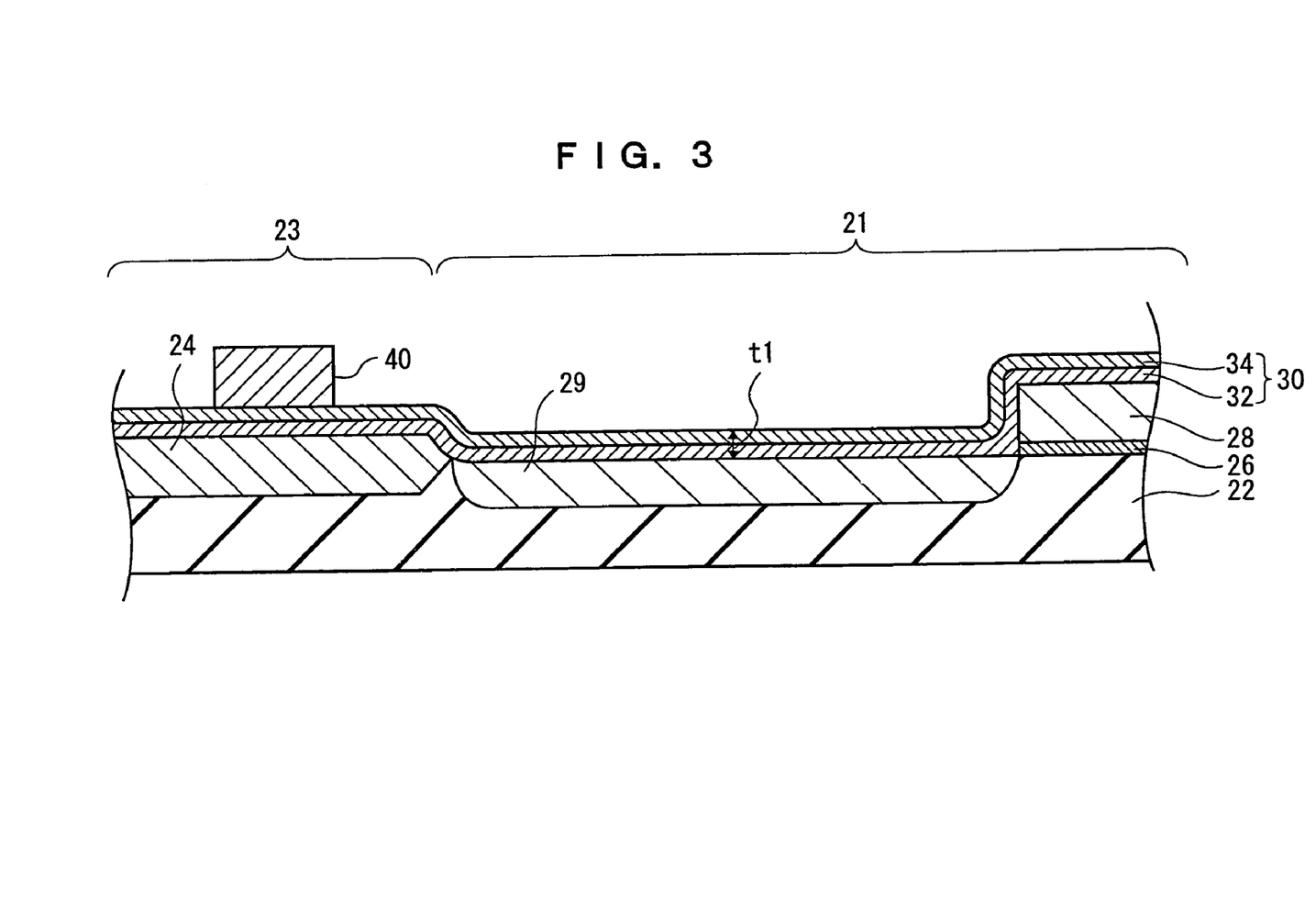
FIG. 3 is a process diagram for explaining the semiconductor device fabrication method of the first embodiment.

Next, a resistance material layer 42 featuring a predetermined resistance value is formed on the resistance isolation oxide layer 34 of the element isolation region 23, and then the resistance material layer 42 is worked to form a resistance. The resistance material layer 42 is formed by, for example, the following process. Firstly, a polysilicon layer is formed on the resistance isolation oxide layer 34 by a CVD process in a $SiH_4$ atmosphere. The polysilicon layer is formed to a thickness of about 150 nm. Next, an impurity is implanted into the polysilicon layer, and the polysilicon layer becomes the resistance material layer 42 with the predetermined resistance value. Here, for example, phosphorus (P) or the like is implanted as the impurity (FIG. 2). Thereafter, the resistance material layer 42 is worked, by photolithography and dry etching, to form a resistance 40 (FIG. 3).

Figure 4:
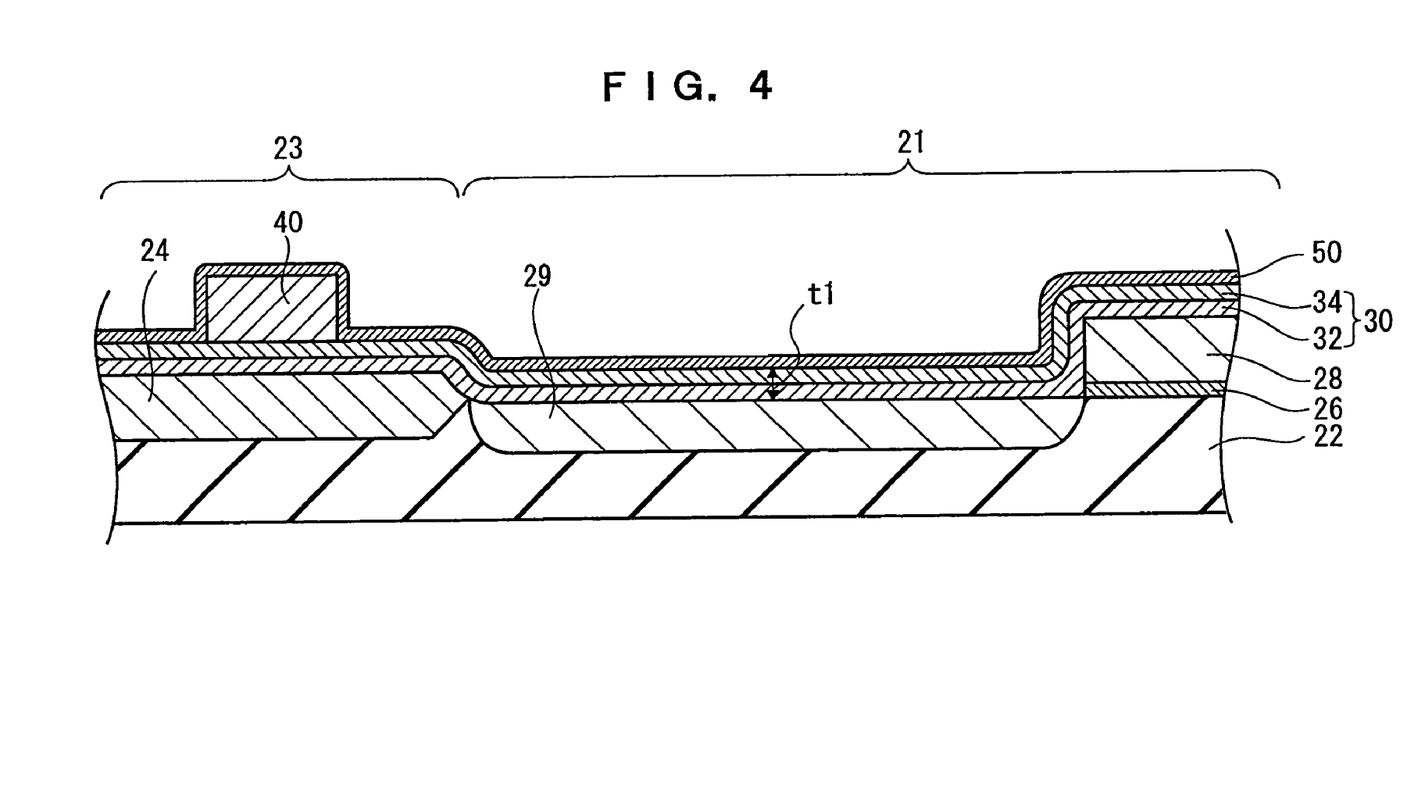
FIG. 4 is a process diagram for explaining the semiconductor device fabrication method of the first embodiment.

Next, by a low-pressure CVD process in a mixed gas atmosphere of $SiH_2Cl_2$ and $NH_3$, a silicon nitride layer 50 is formed on the resistance isolation oxide layer 34 and the resistance 40. In consideration of stresses increasing and wrinkles and the like occurring if the silicon nitride layer 50 were to be too thick, the silicon nitride layer 50 is formed with a thickness of around 15 nm. Reasons for forming the silicon nitride layer 50 will be described later (FIG. 4).

Next, by an atmospheric-pressure CVD process using TEOS, a BPSG (boro-phospho silicate glass) layer is formed to around 1200 nm on the silicon nitride layer.

Figure 5:
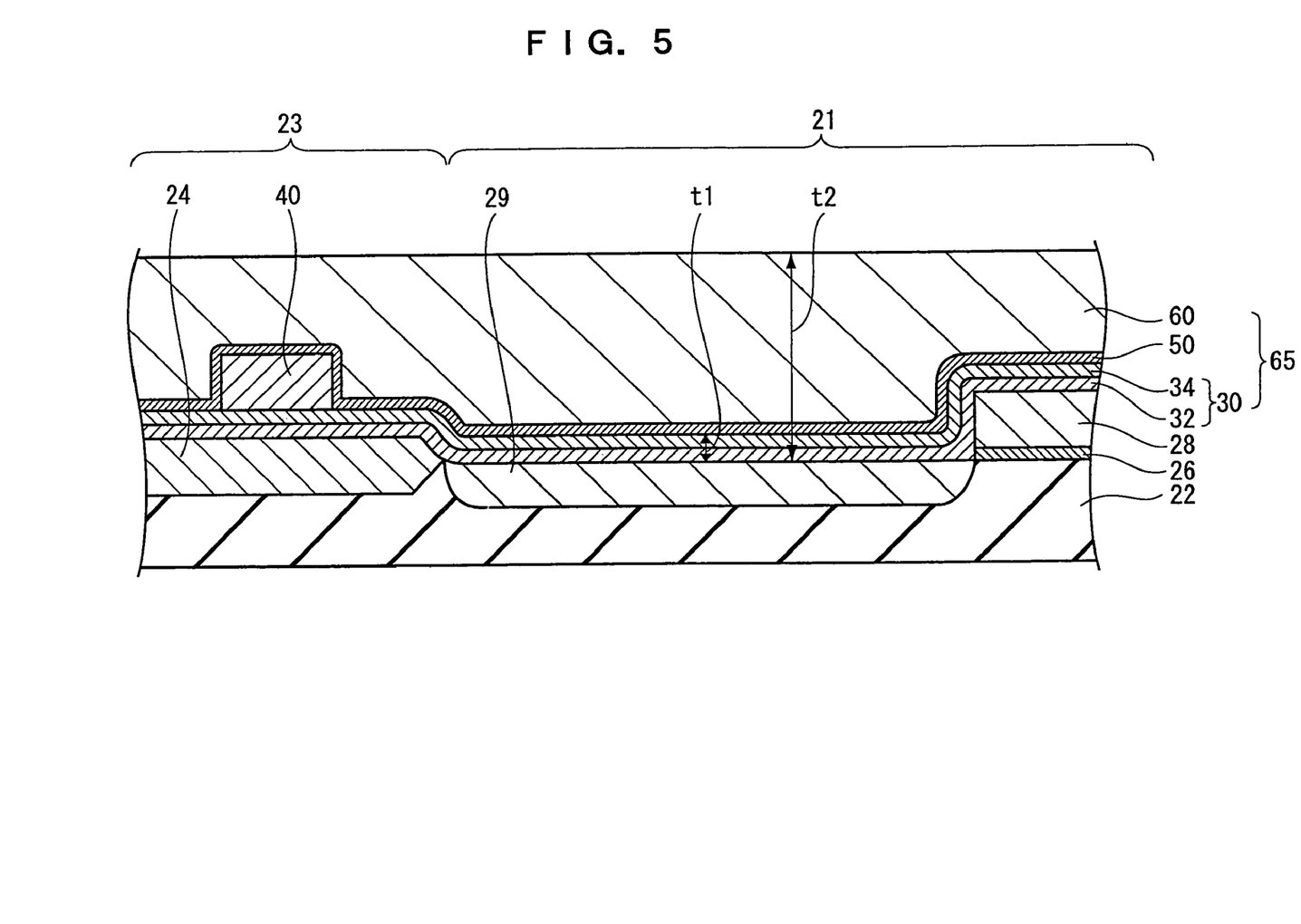
FIG. 5 is a process diagram for explaining the semiconductor device fabrication method of the first embodiment.

Thereafter, SOG (spin-on glass), which is a planarizing material, is coated by a spin coater, after which dry etching is performed over the whole surface by etch-back, to planarize the surface, and an inter-layer insulation layer 60 is obtained (FIG. 5).

Now, the silicon nitride layer 50 is provided for the following two reasons: firstly, to prevent hydrogen ingressing into the silicon substrate at a time of heating processing in a hydrogen atmosphere for formation of electrodes and the like; and secondly, to prevent phosphorus and boron included in the BPSG layer that structures the inter-layer insulation layer 60 reaching the transistor and forming a solid solution.

The resistance isolation oxide layer 34 is provided in order to prevent the silicon substrate 22 being exposed due to the mask oxide layer 32 being etched during the etching for forming the resistance 40. If the silicon substrate 22 were to be exposed, a region at which the silicon nitride layer 50 and the silicon substrate 22 touched would be formed, and an interface current would flow at the region at which the silicon nitride layer 50 and the silicon substrate 22 touched, which would be a cause of leaks.

According to a standard that is used when forming a usual contact hole, a thickness t2 of a laminate 65—of the silicon oxide layer 30, which is provided with the mask oxide layer 32 and the resistance isolation oxide layer 34, the silicon nitride layer 50 and the inter-layer insulation layer 60—is, consequent to the planarization, 1050±100 nm. A thickness t1 of the silicon oxide layer 30 is 40±8 nm. Thus, a ratio r of the thickness t1 of the silicon oxide layer 30 to the thickness t2 of the laminate 65 (=t1/t2) is a value in a range from 2.8% to 5.1%.

Figure 6:
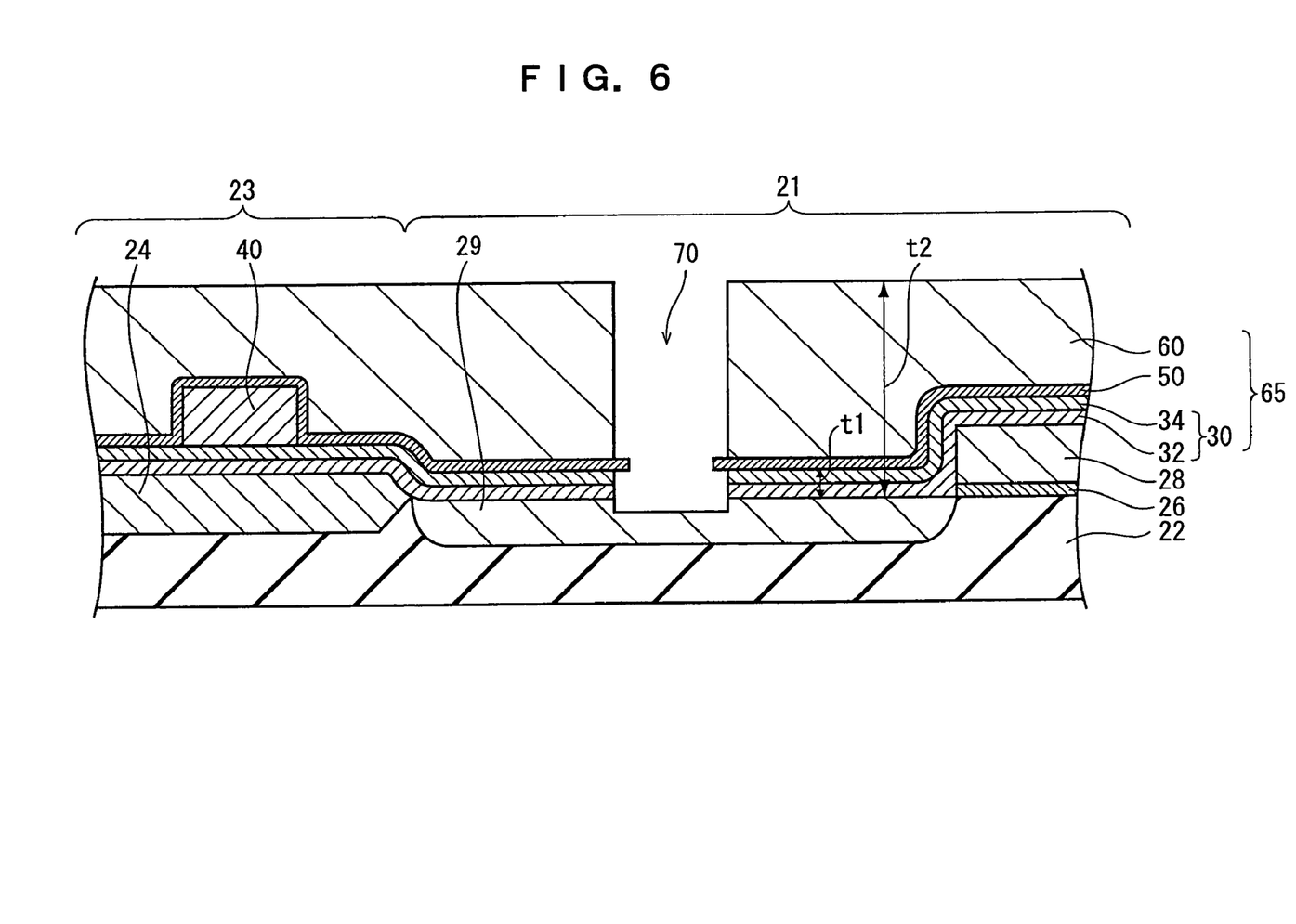
FIG. 6 is a process diagram for explaining the semiconductor device fabrication method of the first embodiment.

Next, a contact hole 70 is formed penetrating through the laminate 65 of the silicon oxide layer 30, the silicon nitride layer 50 and the inter-layer insulation layer 60. Formation of the contact hole 70 is implemented by photolithography and dry etching. The contact hole 70 is formed until the diffusion layer 29 of the MOS transistor formation region 21 is exposed (FIG. 6).

Figure 7:
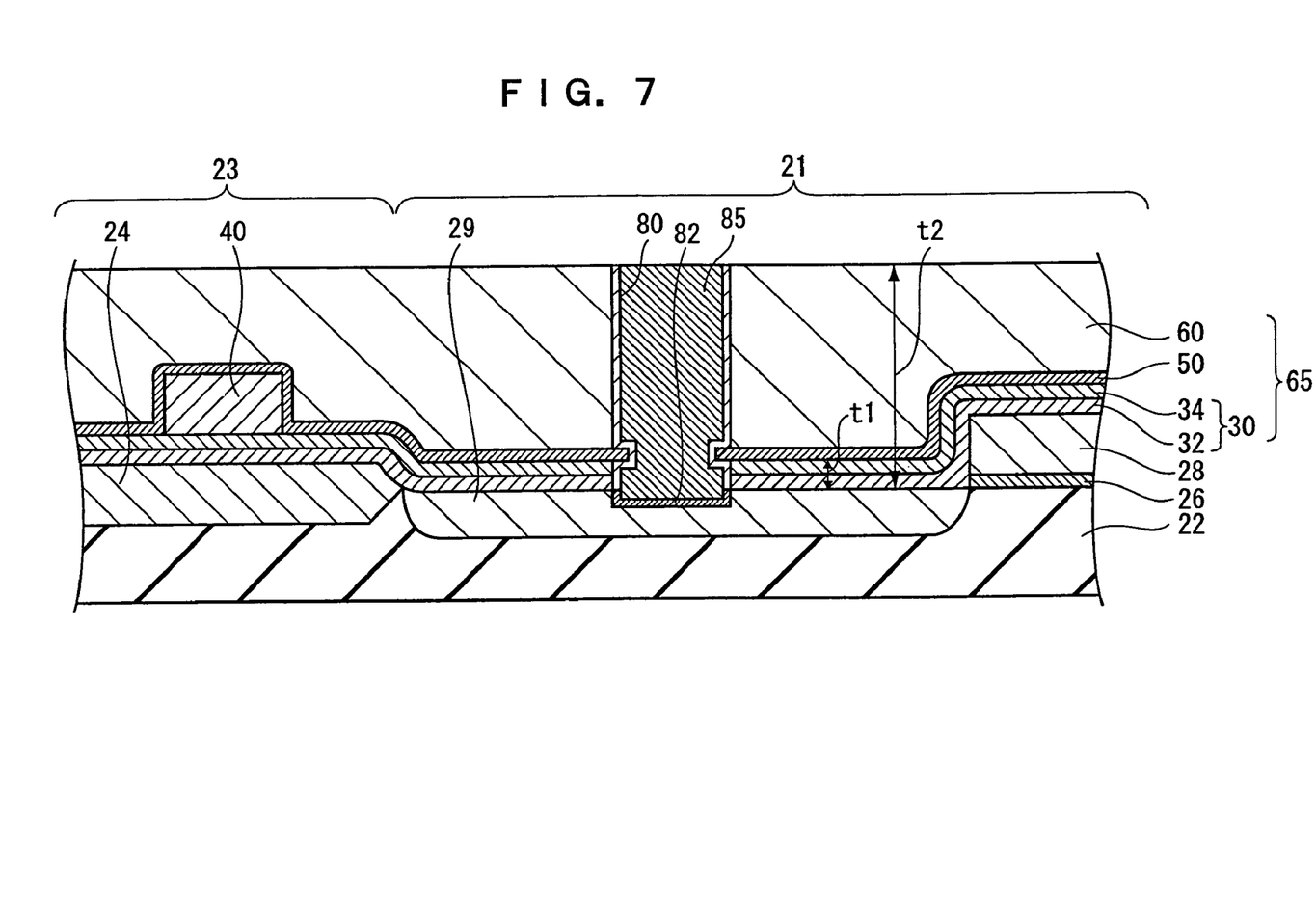
FIG. 7 is a process diagram for explaining the semiconductor device fabrication method of the first embodiment.

Next, a titanium conduction layer 80 is formed on an inner wall surface of the contact hole 70 by sputtering. Thereafter, by an annealing treatment at around 800° C., a titanium silicide 82 is formed at the titanium conduction layer 80 at a lower portion of the contact hole 70. Thereafter, by a low-pressure CVD process in an atmosphere including $WF_6$, a contact plug 85 is formed (FIG. 7).

After the contact plug 85 has been formed, steps for formation of a wiring layer and suchlike may be performed by conventionally known methods, and these will not be described here.

According to the method for fabrication of a semiconductor device of the first embodiment, a thickness of the silicon oxide layer is set to 32 to 48 nm, which is thin in comparison with a conventional 90 nm. Thus, a portion at which the titanium conduction layer is not formed with sufficient thickness at the lower portion of the contact hole is reduced. Therefore, even if the device is left in the atmosphere after the titanium conduction film has been formed, production of unwanted by-products such as silicon oxides and the like due to the silicon substrate reacting with moisture and the like in the air can be suppressed. As a result, excellent titanium silicide can be formed.

SECOND EMBODIMENT

Figure 8:
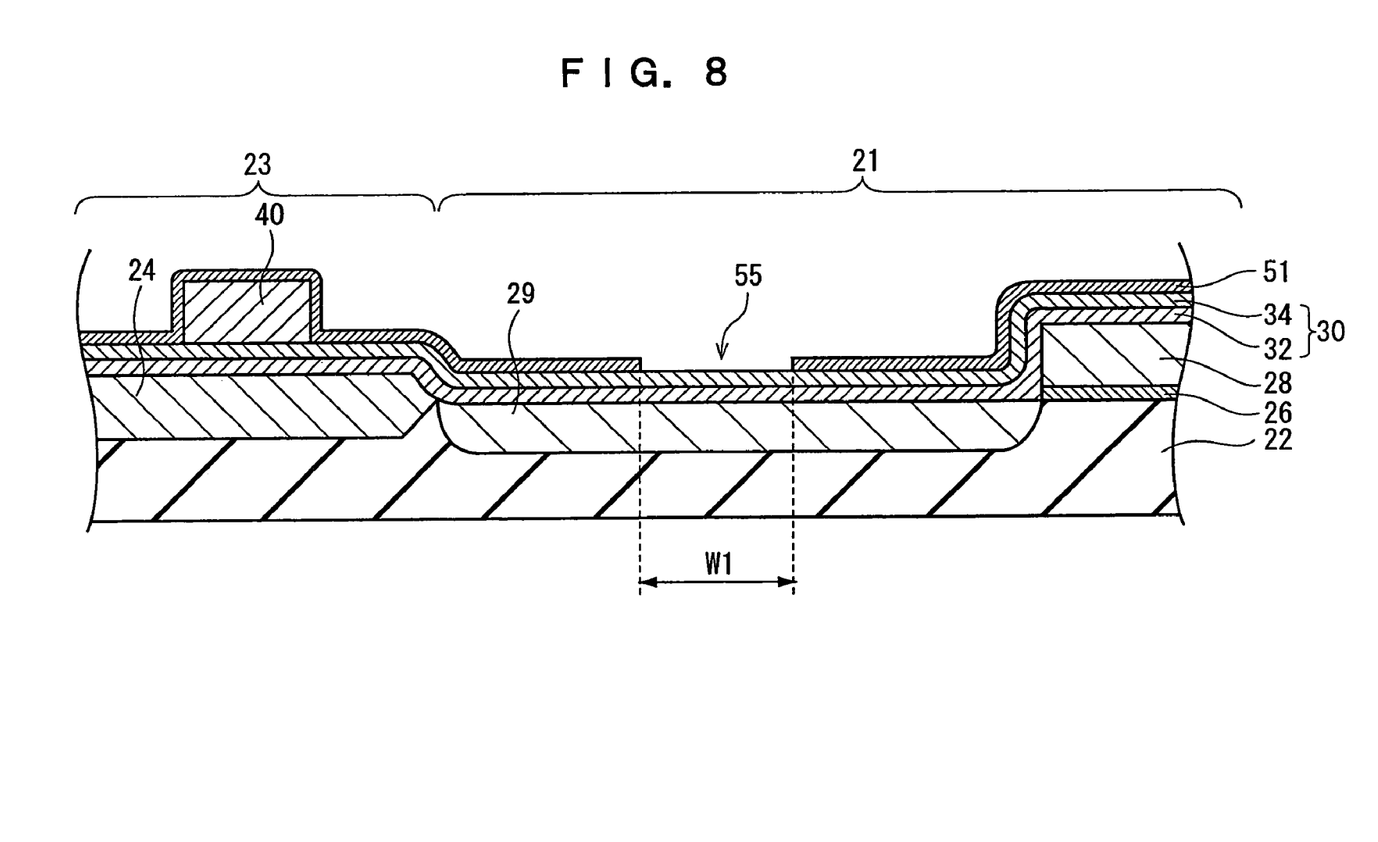
FIG. 8 is a process diagram for explaining a semiconductor device fabrication method of a second embodiment.
Figure 9:
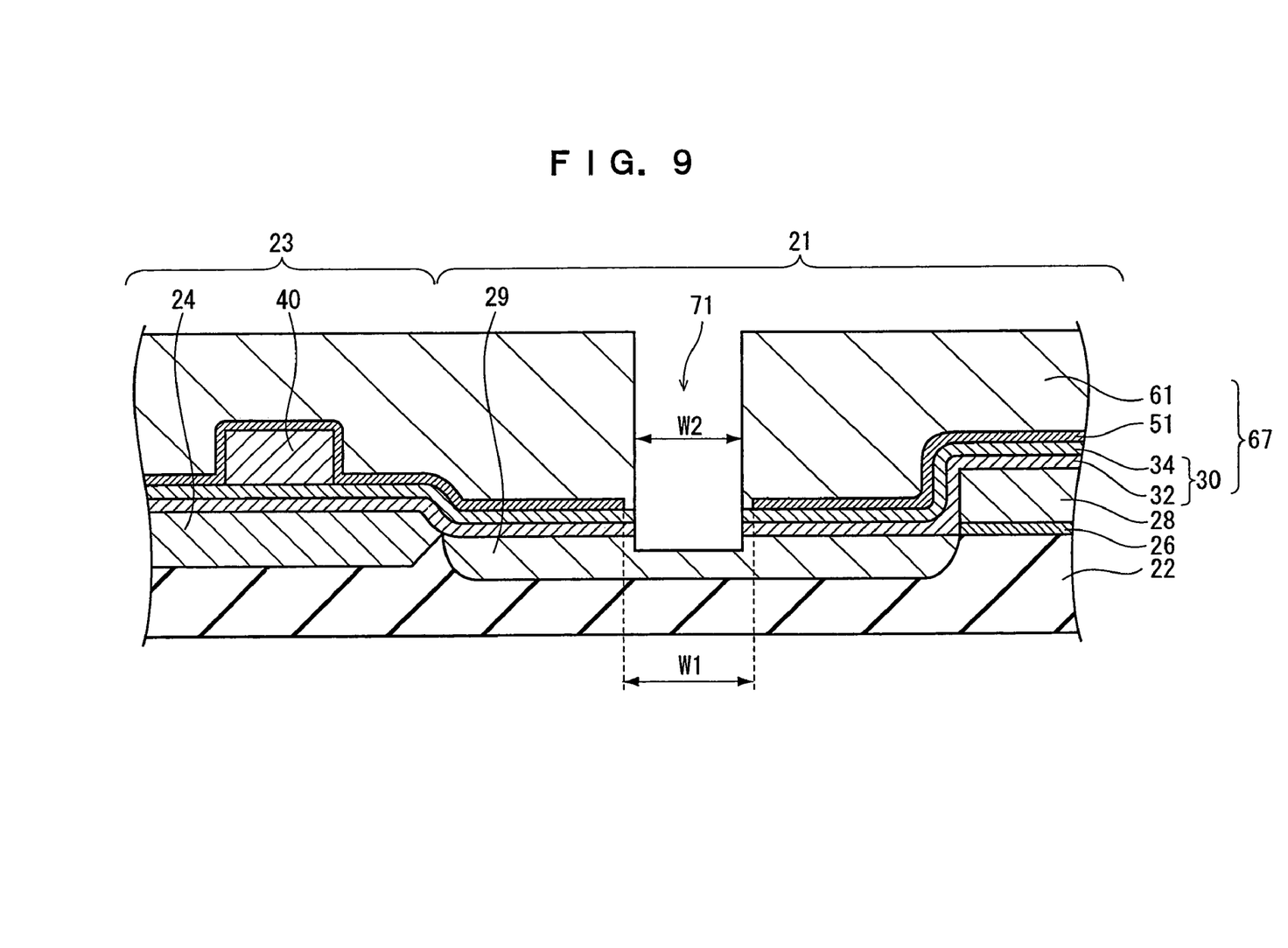
FIG. 9 is a process diagram for explaining the semiconductor device fabrication method of the second embodiment.

A semiconductor device fabrication method of a second embodiment will be described with reference to FIGS. 8 and 9. FIGS. 8 and 9 are process diagrams for explaining the semiconductor device fabrication method of the second embodiment, and are shown cut along a sectional plane.

Steps up to the formation of the silicon nitride layer are similar to those described with reference to FIGS. 1 and 2 and FIGS. 3 and 4, and will not be described here. In the second embodiment however, the thickness of the resistance isolation oxide layer 34 is not limited to 20±5 nm, and may be around 70 nm, similarly to a conventional case. When the thickness of the resistance isolation oxide layer 34 is greater, the effect of preventing the phosphorus and boron included in the BPSG layer from reaching the transistor is enhanced.

After a silicon nitride layer 51 has been formed, an aperture portion 55, which exposes the silicon oxide layer 30, is formed in the silicon nitride layer 51. The formation of the aperture portion 55 is performed by conventionally known photolithography and dry etching (FIG. 8).

Next, an inter-layer insulation layer 61 is formed on the silicon nitride layer 51 and the silicon oxide layer 30 which has been exposed in the aperture portion 55. Steps for forming the inter-layer insulation layer are similar to those described with reference to FIG. 5, and will not be described here.

Then, a contact hole 71 is formed penetrating through a laminate 67 of the silicon oxide layer 30, the silicon nitride layer 51 and the inter-layer insulation layer 61. Formation of the contact hole 71 is implemented by photolithography and dry etching. The contact hole 71 is formed until the diffusion layer 29 of the MOS transistor formation region 21 is exposed. Here, the contact hole 71 is formed at a region inside the aperture portion 55 that has been formed in the silicon nitride layer 51. In consideration of variations in mask fitting accuracy, dimensions and the like, a diameter W1 of the aperture portion 55 that is formed in the silicon nitride layer 51 may be set to a value in a range from 1.05 to 1.3 times a diameter W2 of the contact hole 71 (FIG. 9).

Thereafter, steps for forming a titanium conduction layer, a titanium silicide and a contact plug in the contact hole are similar to those described for the first embodiment and will not be described here.

According to the method for fabrication of a semiconductor device of the second embodiment, the inter-layer insulation layer is formed and the contact hole formed after the aperture in the silicon nitride layer has been formed. Therefore, the silicon nitride layer will not remain in a flange form at the inner wall of the contact hole. Therefore, the titanium conduction layer is formed with sufficient thickness even at the lower portion of the contact hole, and as a result, excellent titanium silicide can be formed.

For the first embodiment and the second embodiment, cases have been described in which a mixture of MOS transistors and resistances on the same silicon substrate is formed. However, these examples are not limiting. The present invention is also applicable to a case of fabricating a semiconductor device which is provided with contact holes passing through a laminate of a silicon oxide layer, a silicon nitride layer and a BPSG layer.

What is claimed is:

1. A method for fabricating a semiconductor device, comprising:
   preparing an underlying structure;
   forming a silicon oxide layer on the underlying structure;
   forming a silicon nitride layer on the silicon oxide layer;
   forming an inter-layer insulation layer on the silicon nitride layer; and
   forming a contact hole that penetrates through a laminate of the silicon oxide layer, the silicon nitride layer and the inter-layer insulation layer,
   wherein a thickness of the silicon oxide layer at a region at which the contact hole is formed is a value in a range from 32 nm to 48 nm.

2. A method for fabricating a semiconductor device, comprising:
   preparing an underlying structure at a silicon substrate, the underlying structure being provided with an element isolation region and a MOS transistor formation region which is defined by the element isolation region, and a gate oxide film and a gate electrode being formed at the MOS transistor formation region;
   forming a mask oxide layer on the underlying structure;
   performing ion-implantation for forming a diffusion layer at a region of the silicon substrate that is to function as a source and drain of a MOS transistor;
   forming a resistance isolation oxide layer on the mask oxide layer;
   forming a resistance material layer on the resistance isolation oxide layer, the resistance material layer including a predetermined resistance value;
   working the resistance material layer for forming a resistance on the resistance isolation oxide layer within a region corresponding to the element isolation region;
   forming a silicon nitride layer on the resistance isolation oxide layer and the resistance;
   forming an inter-layer insulation layer on the silicon nitride layer; and
   forming a contact hole that penetrates through a laminate of the mask oxide layer, the resistance isolation oxide layer, the silicon nitride layer and the inter-layer insulation layer,
   wherein a thickness of a silicon oxide layer that is structured by the mask oxide layer and the resistance isolation oxide layer being laminated is a value in a range from 32 nm to 48 nm.

3. The semiconductor device fabrication method of claim 1, wherein the thickness of the silicon oxide layer is a value in a range from 2.8% to 5.1% of a thickness of the laminate.

4. The semiconductor device fabrication method of claim 2, wherein the thickness of the silicon oxide layer is a value in a range from 2.8% to 5.1% of a thickness of the laminate.

5. A method for fabricating a semiconductor device, comprising:
   preparing an underlying structure;
   forming a silicon oxide layer on the underlying structure;
   forming a silicon nitride layer on the silicon oxide layer;
   forming an aperture portion in the silicon nitride layer, the aperture portion exposing the silicon oxide layer;
   forming an inter-layer insulation layer on the silicon nitride layer and the silicon oxide layer that is exposed in the aperture portion; and
   forming a contact hole that penetrates through a laminate of the silicon oxide layer, the silicon nitride layer and the inter-layer insulation layer at a region inside the aperture portion,
   wherein a diameter of the aperture portion is a value in a range from 1.05 times to 1.3 times a diameter of the contact hole.

6. A method for fabricating a semiconductor device, comprising:
   preparing an underlying structure at a silicon substrate, the underlying structure being provided with an element isolation region and a MOS transistor formation region which is defined by the element isolation region, and a gate oxide film and a gate electrode being formed at the MOS transistor formation region;
   forming a mask oxide layer on the underlying structure;
   performing ion-implantation for forming a diffusion layer at a region of the silicon substrate that is to function as a source and drain of a MOS transistor;
   forming a resistance isolation oxide layer on the mask oxide layer;
   forming a resistance material layer on the resistance isolation oxide layer, the resistance material layer including a predetermined resistance value;
   working the resistance material layer for forming a resistance on the resistance isolation oxide layer within a region corresponding to the element isolation region;
   forming a silicon nitride layer on the resistance isolation oxide layer and the resistance;
   forming an aperture portion in the silicon nitride layer, the aperture portion exposing the resistance isolation oxide layer;
   forming an inter-layer insulation layer on the silicon nitride layer and the resistance isolation oxide layer that is exposed in the aperture portion; and
   forming a contact hole that penetrates through a laminate of the mask oxide layer, the resistance isolation oxide layer, the silicon nitride layer and the inter-layer insulation layer at a region inside the aperture portion,
   wherein a diameter of the aperture portion is a value in a range from 1.05 times to 1.3 times a diameter of the contact hole.

* * * * *